United States Patent
Chen et al.

(10) Patent No.: US 7,310,226 B2
(45) Date of Patent: Dec. 18, 2007

(54) MODULARIZED REDUNDANT HEAT SINK FOR DISSIPATING HEAT GENERATED FROM CHIPS

(75) Inventors: Richard Chen, San Jose, CA (US); Yen Lun Lee, Fremont, CA (US)

(73) Assignee: Super Micro Computer, Inc., San Jose, CA (US)

( * ) Notice: Subject to any disclaimer, the term of this patent is extended or adjusted under 35 U.S.C. 154(b) by 108 days.

(21) Appl. No.: 11/283,974

(22) Filed: Nov. 22, 2005

(65) Prior Publication Data

US 2007/0115632 A1    May 24, 2007

(51) Int. Cl.
*H05K 7/20* (2006.01)

(52) U.S. Cl. .................. 361/695; 361/692; 361/697; 361/719; 165/80.3; 165/104.33; 165/121; 165/185; 257/712; 257/722; 174/16.3

(58) Field of Classification Search ........ 361/692–695, 361/702–704, 719, 688; 165/80.2–80.5, 165/104.33, 104.34, 104.19, 185, 104.21, 165/122, 104.26; 257/718, 719, 712, 722; 174/16.3
See application file for complete search history.

(56) References Cited

U.S. PATENT DOCUMENTS

| | | | | |
|---|---|---|---|---|
| 5,384,940 A | * | 1/1995 | Soule et al. .................. | 24/453 |
| 5,653,280 A | * | 8/1997 | Porter ........................ | 165/80.3 |
| 5,730,210 A | * | 3/1998 | Kou .......................... | 165/80.3 |
| 5,787,971 A | * | 8/1998 | Dodson ...................... | 165/121 |
| 6,172,416 B1 | * | 1/2001 | Miyahara et al. ........... | 257/712 |
| 6,368,064 B1 | * | 4/2002 | Bendikas et al. ............. | 417/2 |
| 6,667,885 B2 | * | 12/2003 | Malone et al. .............. | 361/700 |
| 6,752,577 B2 | * | 6/2004 | Chen et al. ................. | 411/508 |
| 6,958,914 B2 | * | 10/2005 | Hoss .......................... | 361/704 |
| 6,981,542 B2 | * | 1/2006 | Lopatinsky et al. ........ | 165/80.3 |
| 7,031,162 B2 | * | 4/2006 | Arvelo et al. ............... | 361/718 |
| 7,133,287 B2 | * | 11/2006 | Campini et al. ............ | 361/719 |
| 7,164,583 B2 | * | 1/2007 | Lee et al. ................... | 361/704 |

* cited by examiner

*Primary Examiner*—Michael Datskovskiy
(74) *Attorney, Agent, or Firm*—Lowe Hauptman Ham & Berner, LLP (57) ABSTRACT

A modularized redundant heat sink for dissipating heat generated from chips includes an independent rectangular fin whose sides are provided with at least more than two elastic pins, and which is provided with a bottom surface for conducting temperature; a circuit board on which are welded with at least more than two chips having upper surfaces. A bottom surface of the fin is attached to the upper surfaces of at least more than two chips through a heat conducting glue, so as to provide a temperature conducting and heat dissipating to at least more than two chips by one fin.

3 Claims, 10 Drawing Sheets

MODULARIZED REDUNDANT HEAT SINK FOR DISSIPATING HEAT GENERATED FROM CHIPS

BACKGROUND OF THE INVENTION (a) Field of the Invention

The present invention relates to a heat sink for dissipating heat generated from chips and more particularly to a heat sink device attached to chips on a computer and/or server motherboard.

(b) Description of the Prior Art

Figure 10:
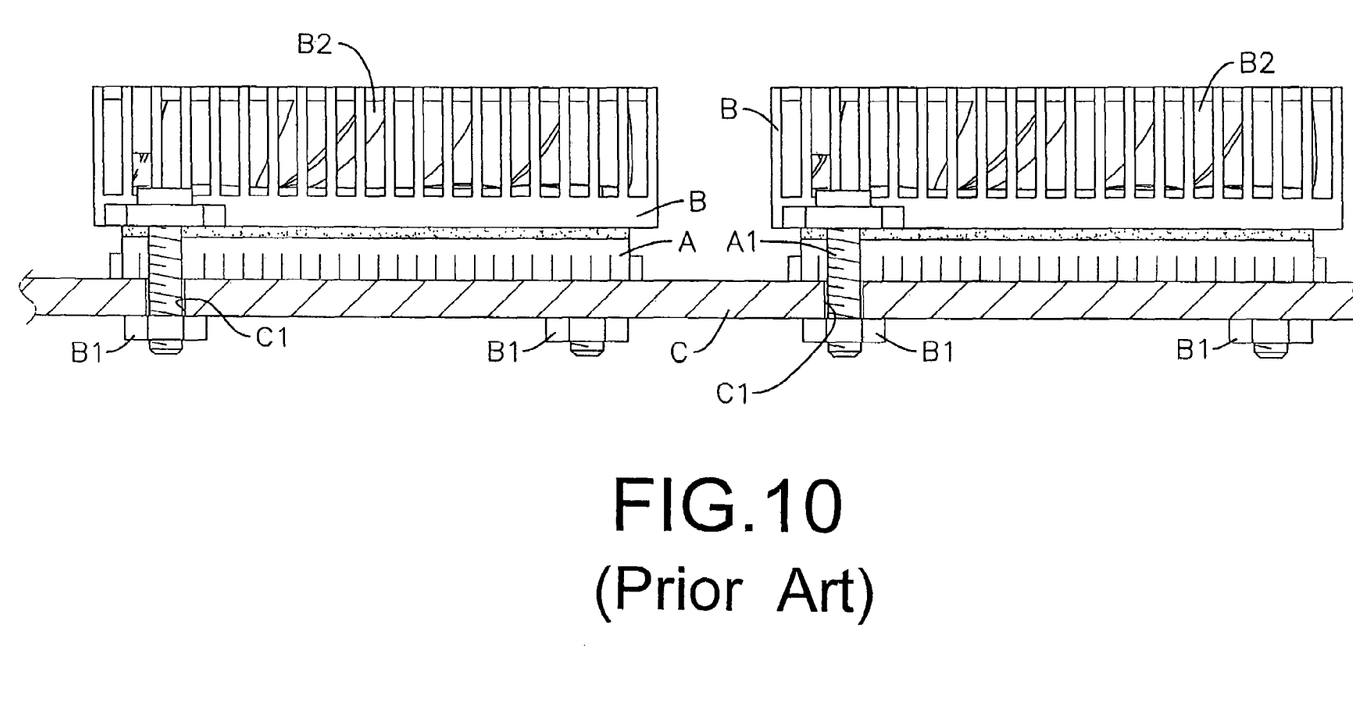
FIG. 10 shows a cross sectional view of a conventional fin assembled on a circuit board.

It is known that pluralities of chips are welded on a motherboard of an industrial computer, server or a commercialized personal computer. As shown in FIG. 10, a fin B made by aluminum is attached on an upper surface of a chip A. If a circuit board C is provided with more than two chips A, then more than two independent fins must be attached on the chips A whose pins A1 are latched on the circuit board C. This conventional technology is provided with the following flaws under a long term of usage:

(1) Each independent fin B should be installed with at least more than one pair of pins A1 latched on latch holes C1 installed on a circuit board C in advance, which will increase cost in assembling and manufacturing.

(2) If a fan B2 is installed in each fin B, then when the fan B2 is broken and stops operating, an operating temperature of a chip A will rise at once, thereby causing the chip A to be damaged.

Accordingly, how to design a modularized redundant heat sink which can dissipate heat generated from more than two chips at the same time, in order to improve the aforementioned drawbacks, has become a technical issue to be solved in the present invention.

SUMMARY OF THE INVENTION

Accordingly, the primary object of present invention is to provide a heat sink for dissipating heat generated from chips, wherein the heat sink can be attached to surfaces of more than two chips at the same time, such that heat dissipating can be provided to at least two chips by installing only one piece of fin on a circuit board, thereby decreasing cost in manufacturing by simplifying components, and facilitating a fast and convenient assembling on the circuit board.

Another object of the present invention is to provide a heat sink for dissipating heat generated from chips, wherein at least more than two fans are installed on the fin, such that if one fan stops working, the other fan can provide a heat dissipating for the entire fin, thereby further preventing an operating temperature of any one chip from exceedingly increasing.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
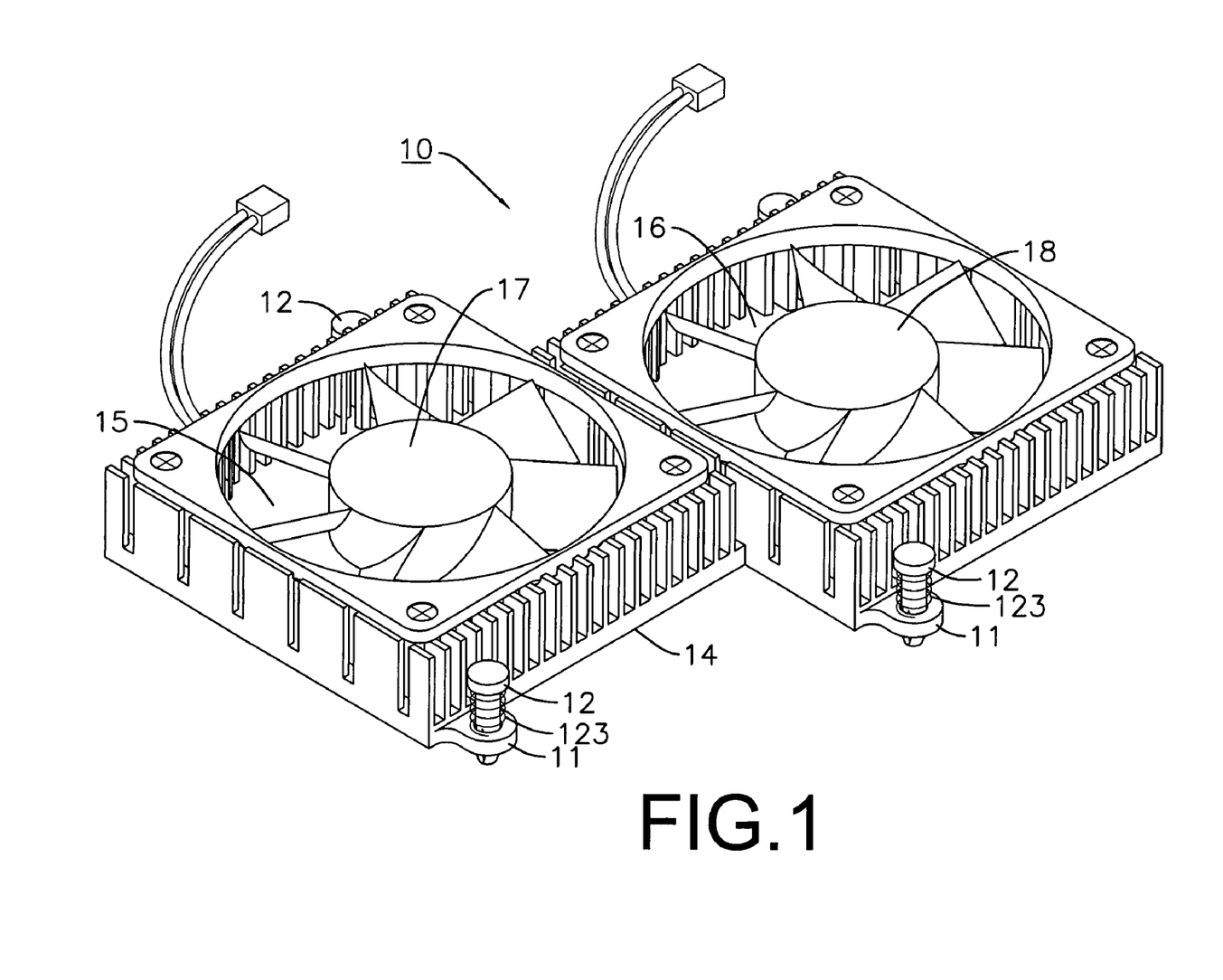
FIG. 1 shows a perspective view of a single fin of the present invention.
Figure 2:
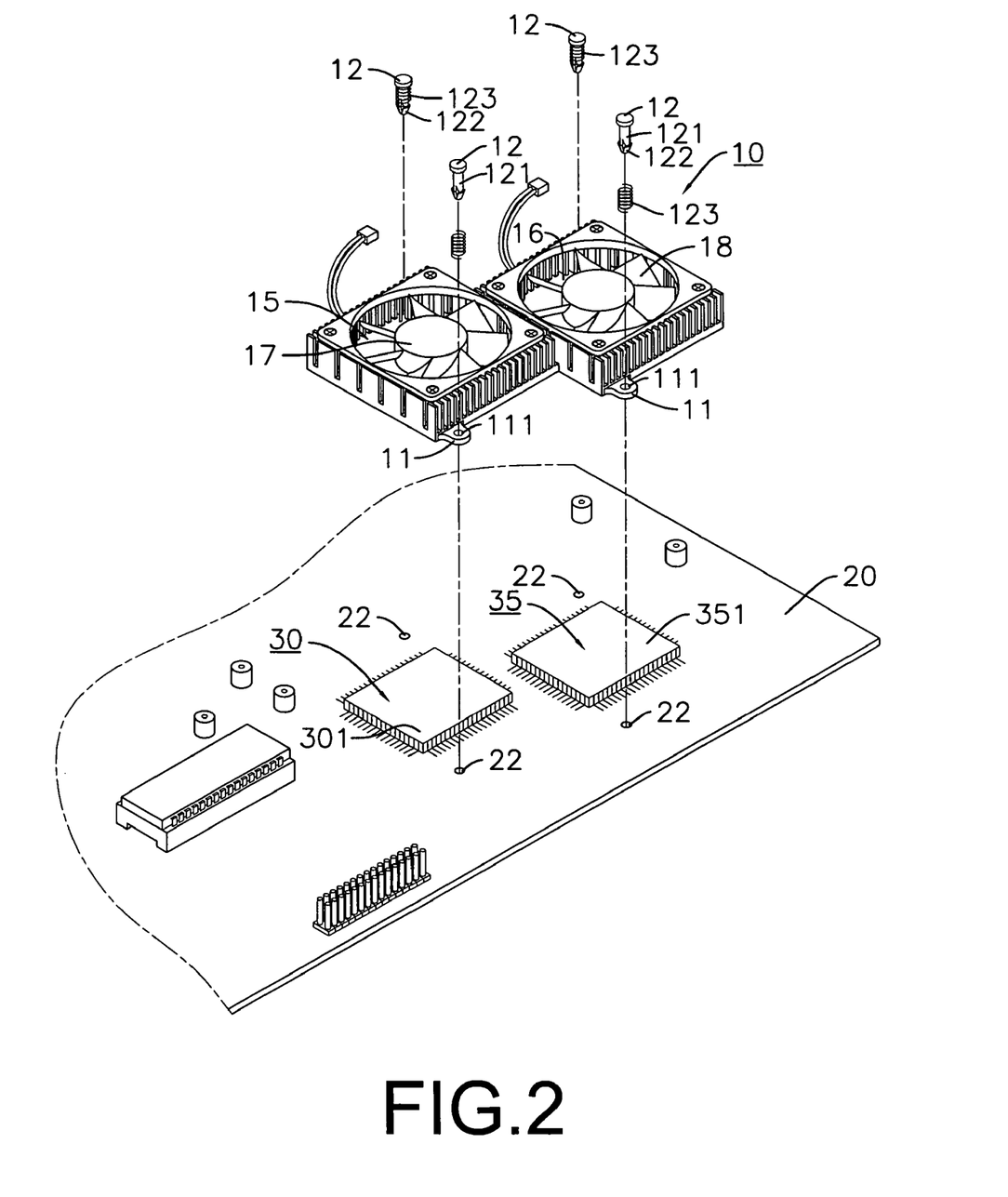
FIG. 2 shows a perspective view upon assembling a single fin on a circuit board of the present invention.
Figure 3:
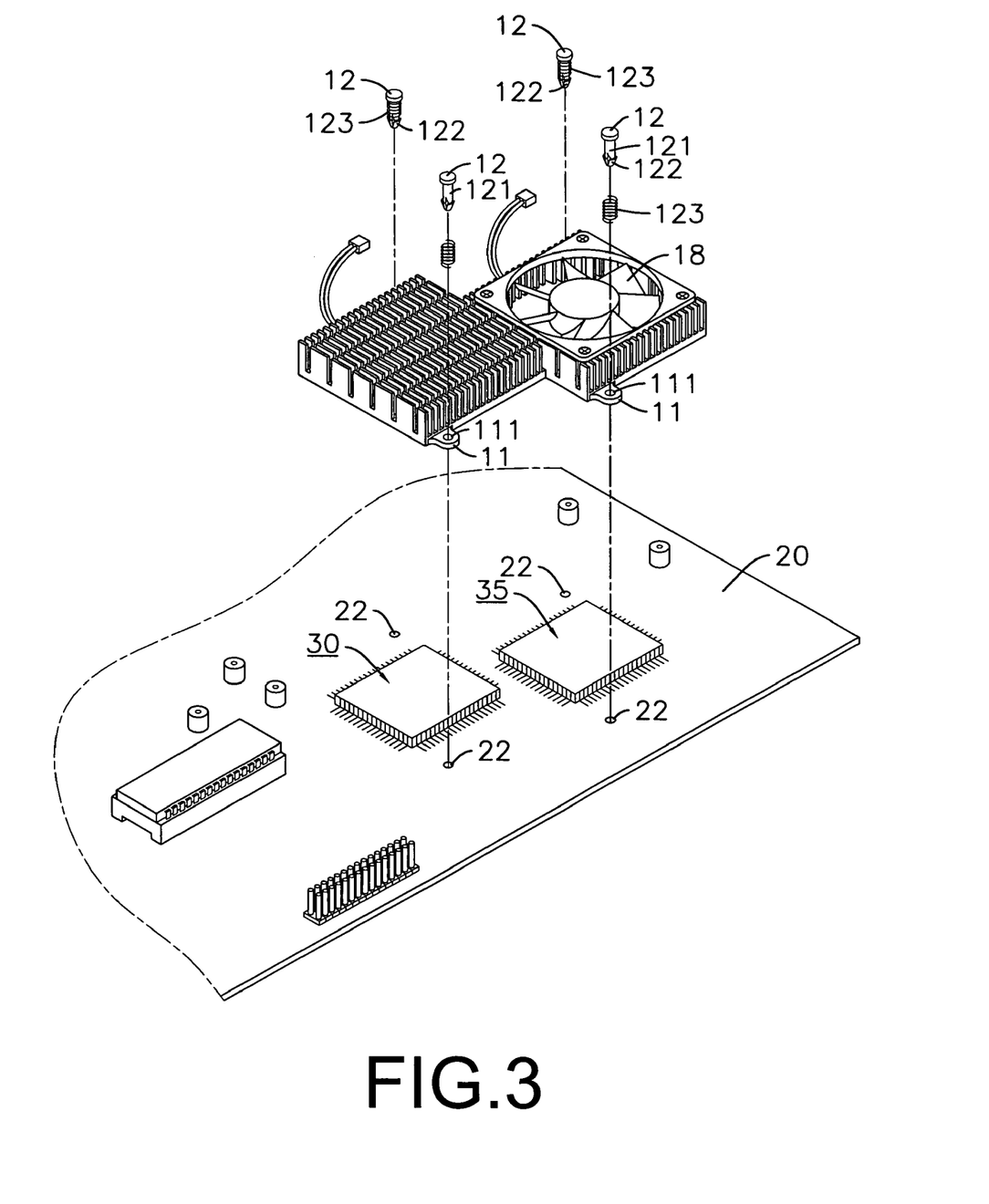
FIG. 3 shows a perspective view upon assembling a single fin on a circuit 15 board of another implementation of the present invention.
Figure 4:
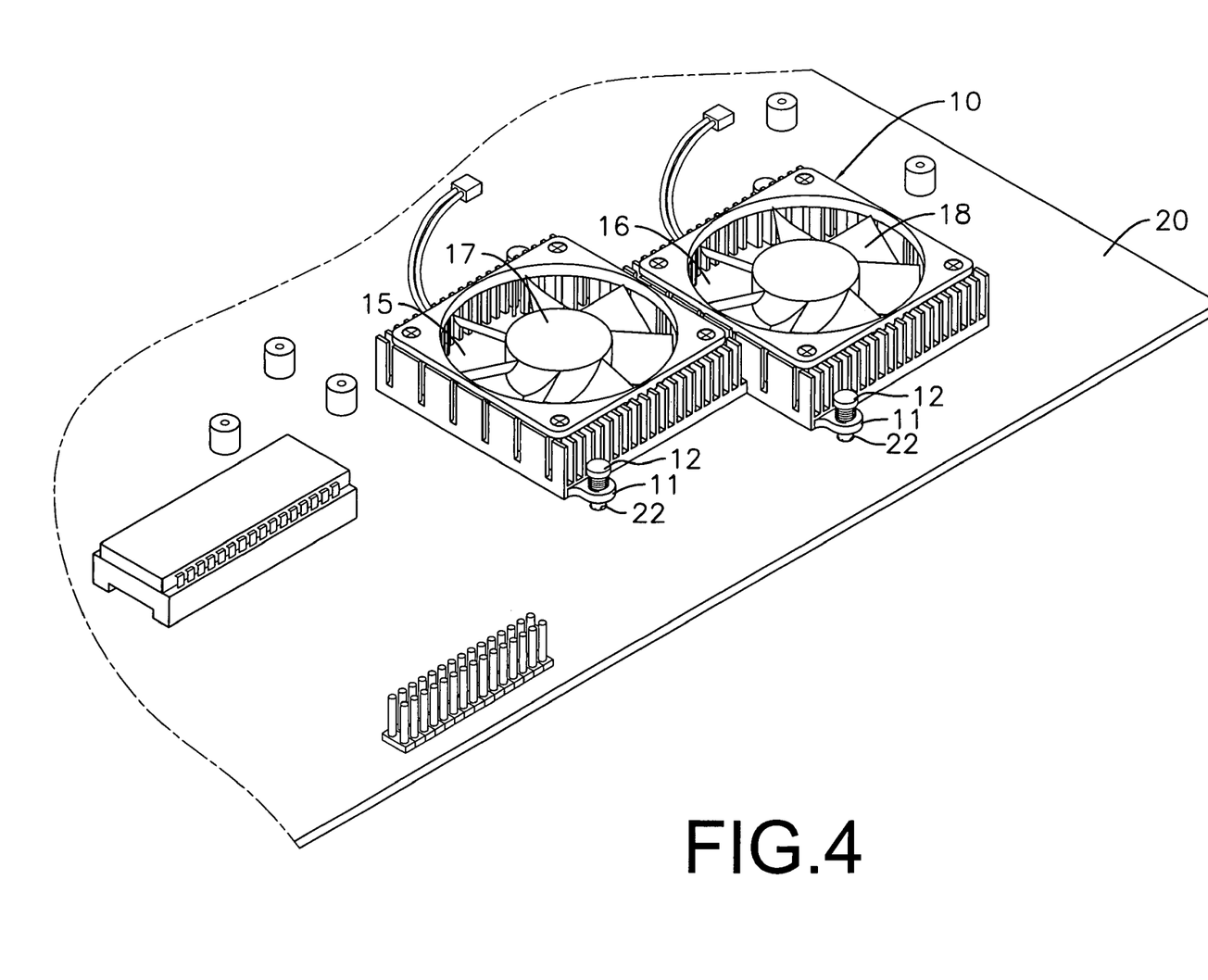
FIG. 4 shows a perspective view of FIG. 2 after assembling.

Referring to FIG. 1, FIG. 2, and FIG. 3, the present invention is to provides a fin for dissipating heat generated from chips, which comprises an independent L-shaped fin 10 whose sides are provided with at least two elastic pins 12, and which is provided with a bottom surface 14 for conducting temperature, and a circuit board 20 on which are welded with at least more than two chips 30, 35 having upper surfaces 301, 351. The bottom surface 14 of fin 10 is attached to the upper surfaces 301, 351 of at least two chips 30, 35 with a heat conducting glue 40, so as to achieve a function of temperature conducting and heat dissipating to at least two chips 30, 35 by one fin 10 (as shown in FIG. 7).

Referring to FIG. 1, the fin 10 is provided with at least one slots 15, 16: which are installed with at least one fans 17, 18.

Figure 8:
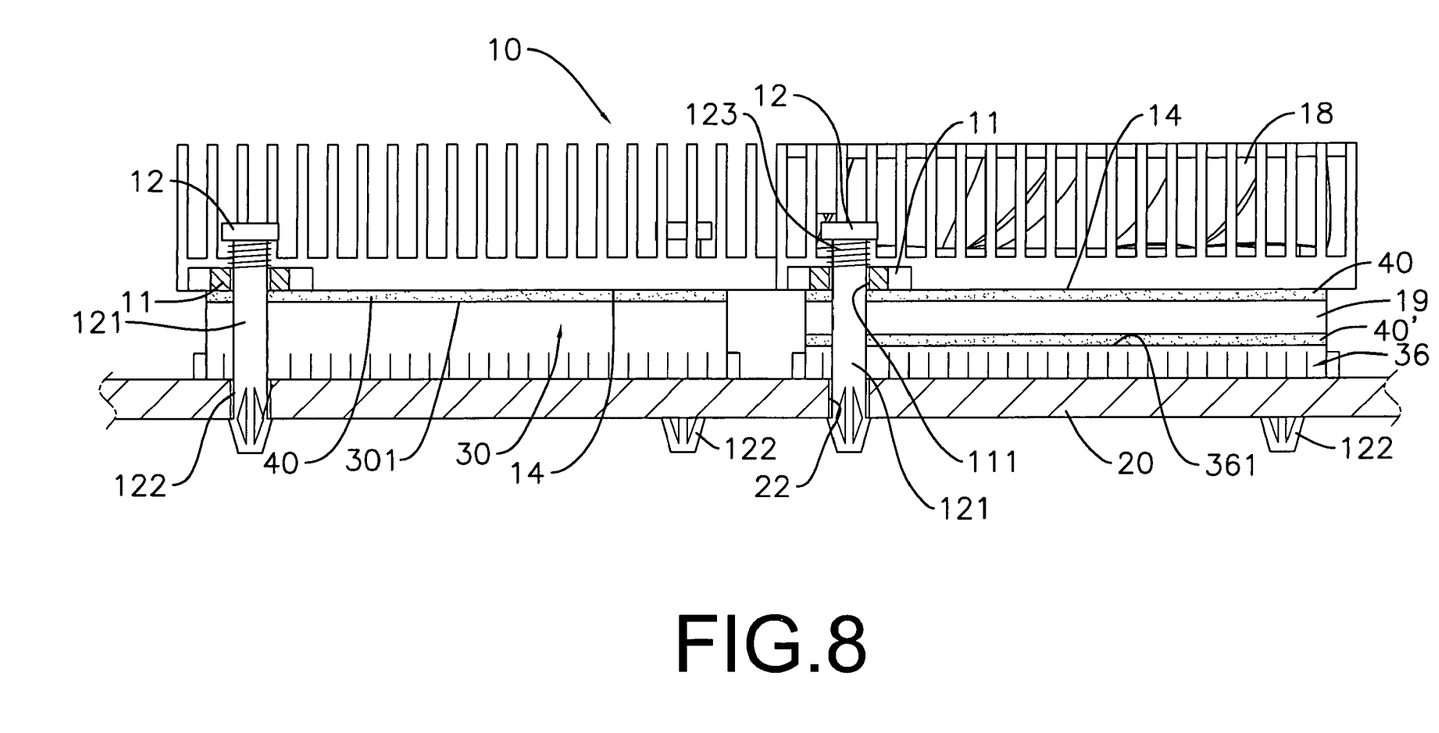
FIG. 8 shows a side view of another implementation of a single fin assembled on a circuit board of the present invention.

Referring to FIG. 8, a projection 11 having a through-hole 111 is extended from a side of fin 10, and an inverted hook 122 having a larger outer diameter is located at a lower end of pin 12. The inverted hook 122 is latched into a positioning hole 22 which is installed on a circuit board 20 in advance. A spring 123 is sheathed to a shaft 121 of pin 12, and the shaft 121 is passed through a through-hole 111, so as to constitute the pin 12 into an elastic element.

Figure 7:
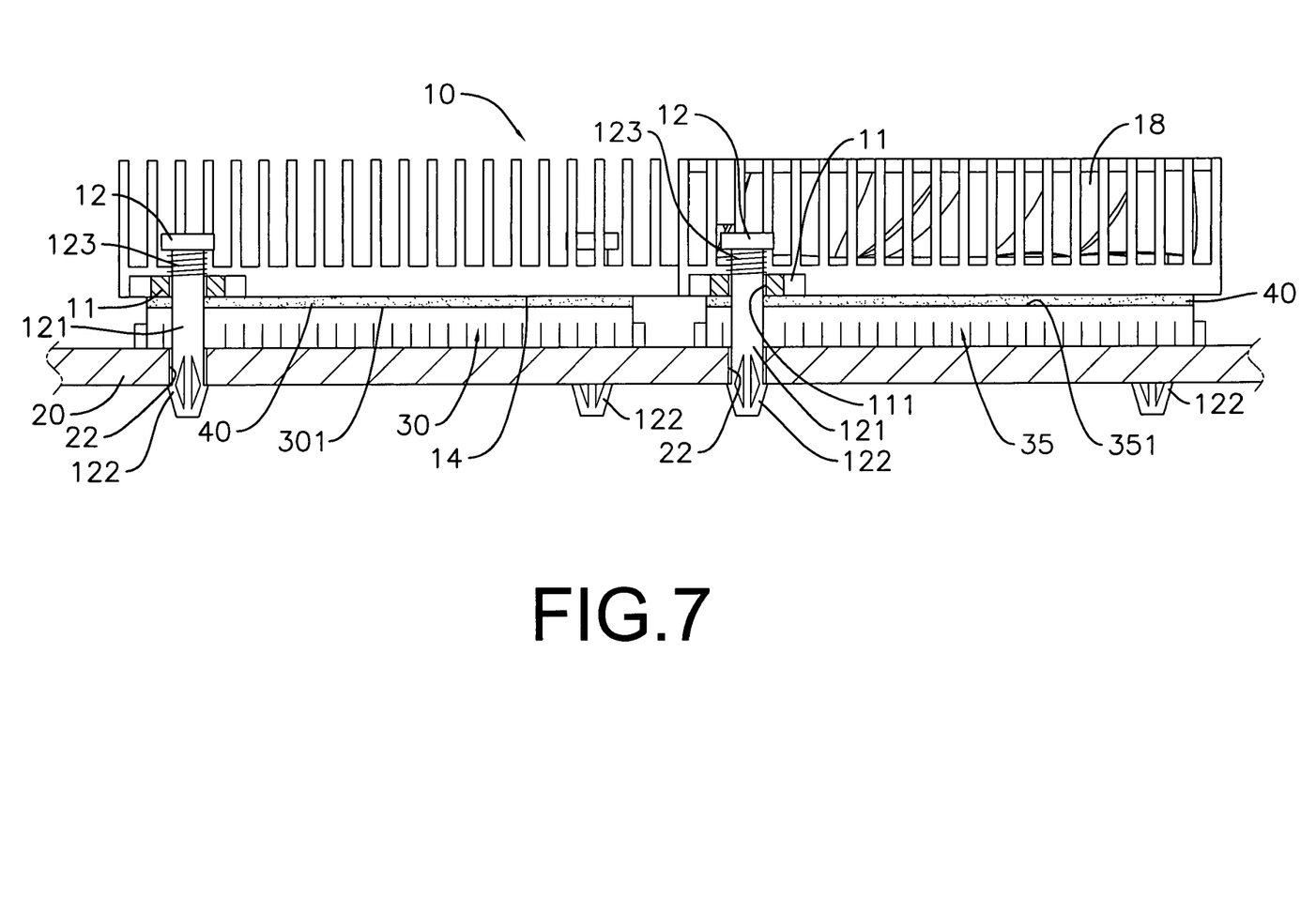
FIG. 7 shows a side view and local cross section of a single heat sink assembled on a circuit board of the present invention.

Referring to FIG. 7, which shows a cross sectional view of a single L-shaped fin 10 attached on surfaces of two chips 30, 35. An inverted hook 122 of an elastic pin 12 is passed through a positioning hole 22 which is installed on a circuit board 20 in advance, such that the inverted hook 122 can be pressed against a periphery of the positioning hole 22. A spring 123 is used to form the entire pin 12 into an elastic member. As two neighboring chips 30, 35 are at a same height; therefore a bottom surface 14 of the fin 10 is coated by a layer of heat conducting glue 40 which is attached to upper surfaces 301, 351 of two chips 30, 35. Accordingly, by fixing a single piece of fin 10 on the circuit board 20, a heat dissipating effect can be implemented to at least two chips 30, 35. This effect can remove a drawback that a single fin is required to be fixed on a single chip.

Referring to FIG. 8, a chip 36 welded on a circuit board 20 is at a height lower than that of a neighboring chip 30. The present invention uses a heat conducting plate 19 of a proper thickness, whose upper surface is attached to a bottom surface 14 with a heat conducting glue 40, and whose lower surface is attached to an upper surface 361 of chip 36 with a heat conducting glue 40, to achieve a function that a single fin 10 can be applied to a plurality of chips 30, 36 of different heights at the same time.

Referring to FIG. 1 and FIG. 2, two fans 17, 18 can be installed in a single fin 10, such that if one fan 17 is broken and not functioning, the other fan 18 can be still rotating to dissipate heat; therefore, temperature of fin 10 will not greatly increase, thereby preventing the operating temperature of chips 30, 35 from rising rapidly.

Figure 6:
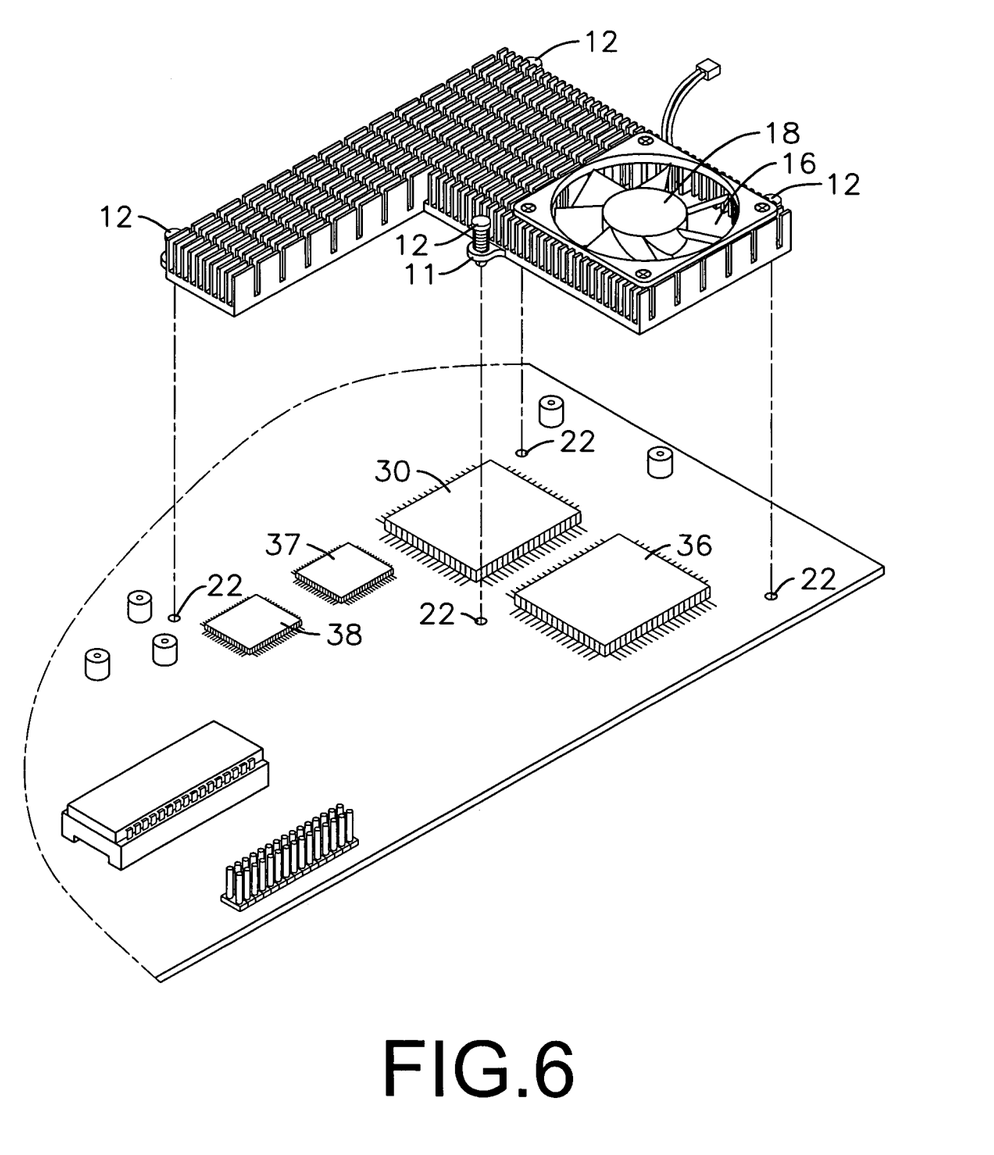
FIG. 6 shows a perspective view upon assembling a single L-shaped 20 fin on a plurality of large and small chips of the present invention.

Referring to FIG. 6, a single fin 10 of the present invention is in a L-shapedi design, which can be attached to chips 30, 36, 37, 38 of different sizes. The fin 10 is widely in contact with upper surfaces of pluralities of chips 30, 36, 37, 38, so as to achieve a heat dissipating to pluralities of chips 30, 36, 37, 38 with a single fin 10 at the same time.

In addition, in the implementation, a single fan 18 can be installed on the single fin 10.

Figure 5:
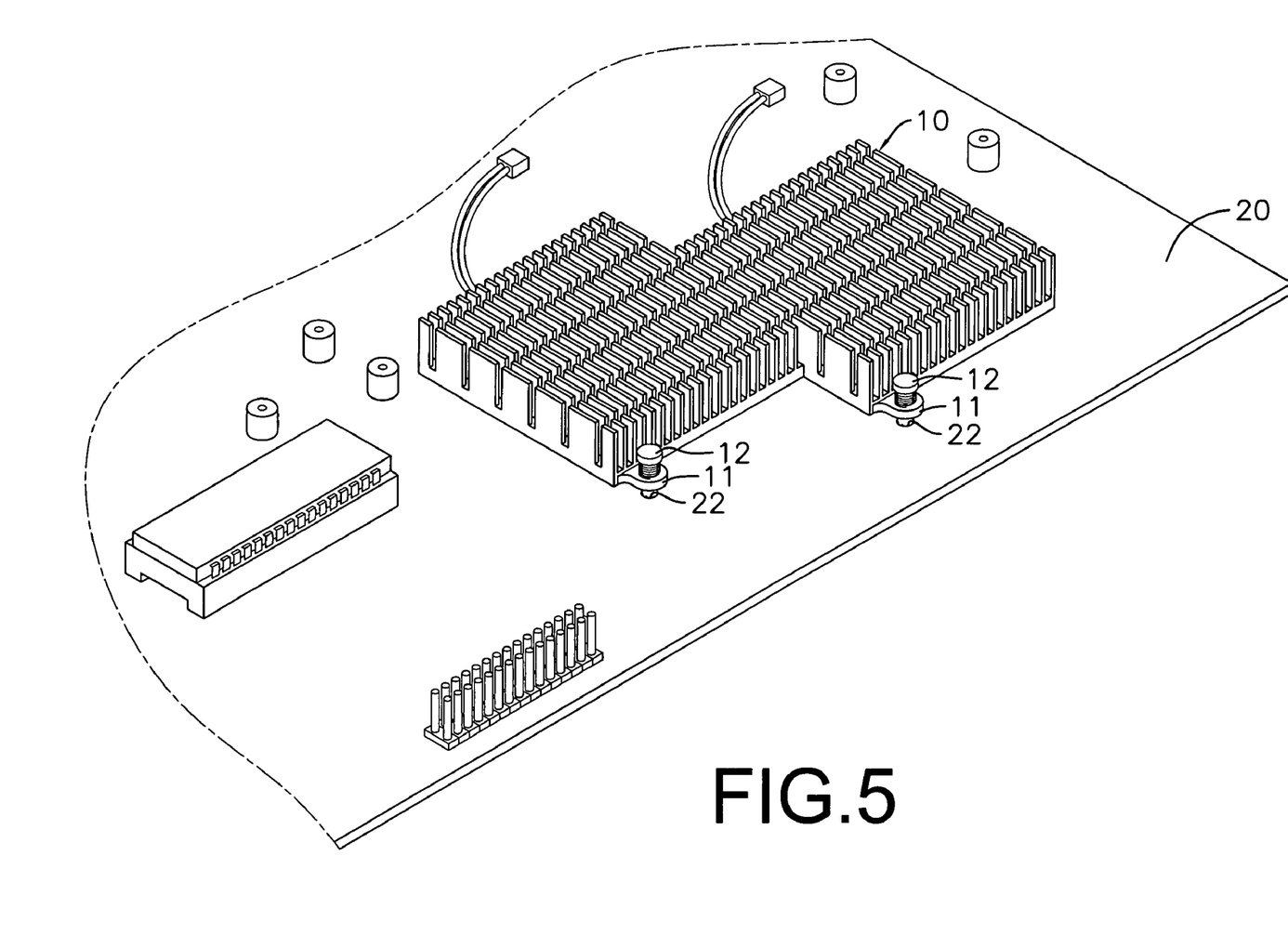
FIG. 5 shows a perspective view of assembling a fin without a fan on a circuit board of the present invention
Figure 9:
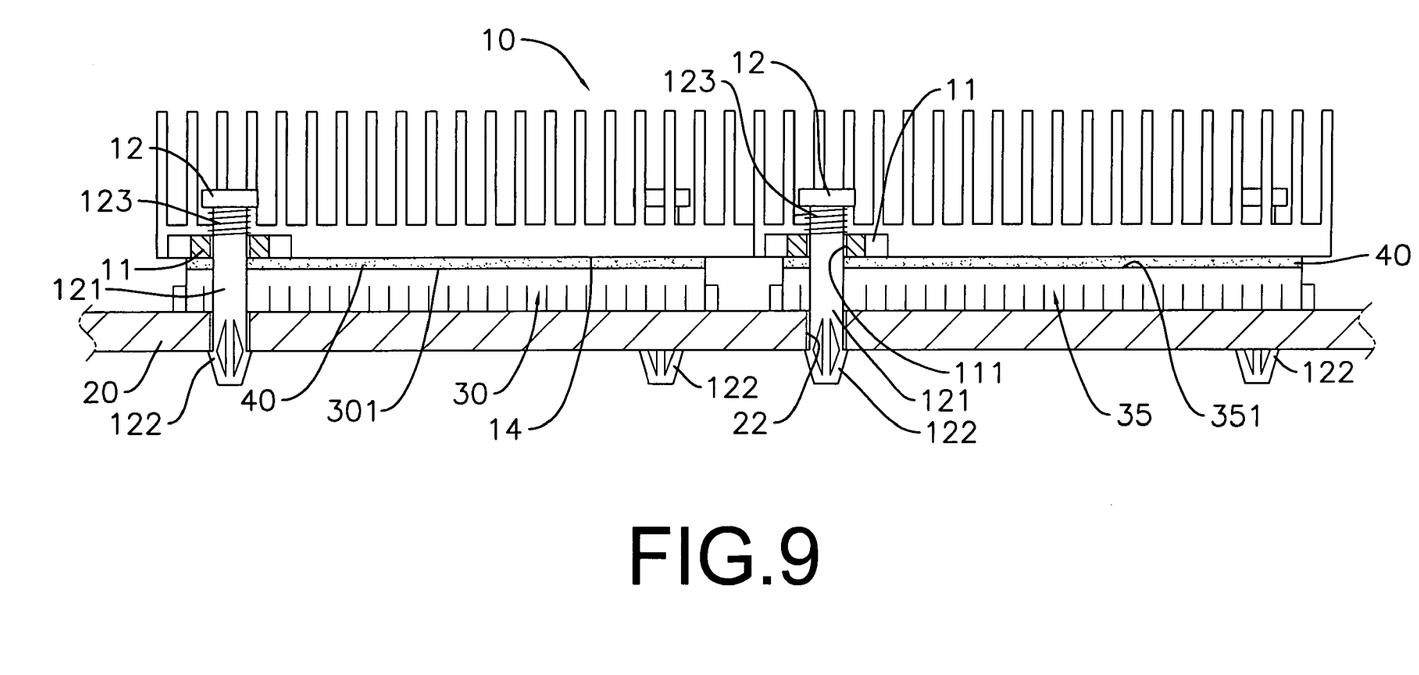
FIG. 9 shows a side view of still another implementation of a single fin without a fan on a circuit board of the present invention.

Referring to FIG. 5 and FIG. 9, if high efficient heat dissipation is not required for chips 30, 35 which only need a heat dissipating with an ordinary fin, then a fan is not needed for a fin 10 of the present invention. A technique for attaching the fin 10 to the chips 30, 35 and a circuit board 20 is the same as that shown in FIG. 7 or FIG. 8. Heat generated from the chips 30, 35 is freely dissipated through the fin 10, which is able to satisfy the standard of heat dissipating of chips 30, 35.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A heat sink for dissipating heat generated from chips, comprising
    An independent L-shaped fin whose sides are provided with at least two elastic pins, and which is provided with a bottom surface for conducting temperature; wherein the fin is provided with at least one slots which are installed with at least one fans, wherein a projection having a through-hole is extended from a side of fin, an inverted hook of larger outer diameter is located at a lower end of pin, and the inverted hook is latched into a positioning hole which is installed on the circuit board in advance; a spring being sheathed to a shaft of pin, and the shaft being passed through the through-hole, so as to constitute the pin into an elastic member, and a circuit board on which are welded with at least two chips having upper surfaces, wherein a bottom surface of fin is attached to the upper surfaces of at least more than two chips through a heat conduction glue, so as to provide a temperature conducting and heat dissipating to at least two chips by one fin.

2. The modularized heat sink for dissipating heat generated from chips according to claim 1, wherein the bottom surface of fin can be connected with a heat conducting plate of a thickness, in order to increase a thickness below the bottom surface, thereby providing an attachment to a thinner chip.

3. The modularized heat sink for dissipating heat generated from chips according to claim 1, wherein two fans can be installed in a single fin, If one fan failed, the other fan will provide adequate air flow to cool down multiple chips.

* * * * *